US006198172B1

United States Patent
King et al.

(10) Patent No.: US 6,198,172 B1
(45) Date of Patent: Mar. 6, 2001

(54) SEMICONDUCTOR CHIP PACKAGE

(75) Inventors: Jerrold L. King, Morgan Hill, CA (US); Leland R. Nevill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/026,584

(22) Filed: Feb. 20, 1997

(51) Int. Cl.[7] .................................................. H01L 23/544
(52) U.S. Cl. .......................... 257/797; 257/730; 257/778; 257/787
(58) Field of Search ................................ 257/797, 778, 257/787, 730

(56) References Cited

U.S. PATENT DOCUMENTS

| | | | |
|---|---|---|---|
| 5,138,429 | 8/1992 | Nagesh et al. | 357/70 |
| 5,637,919 | * 6/1997 | Grabbe | 257/797 |
| 5,677,566 | 10/1997 | King et al. | 257/666 |

* cited by examiner

Primary Examiner—Roy Potter
(74) Attorney, Agent, or Firm—Workman, Nydegger & Seeley

(57) ABSTRACT

An improved semiconductor chip package capable of independently aligning with testing equipment during the manufacturing phase of electrical testing. Independent alignment is realized by directly connecting the semiconductor chip package to the test alignment apparatus by fitting together two substantially conforming surfaces, one on the chip package and one on the alignment apparatus. The conforming surfaces are arranged so that only one matable position is achievable. The substantially conforming surfaces equate to three substantially conical indentations on the chip package and three substantially conical protrusions or protuberances of substantially conforming size and depth extending from the alignment apparatus. Once fitted, the three protrusions suspend the semiconductor chip in a substantially horizontal plane so that electrical test contacts, also substantially in a horizontal plane, may be easily contacted with the conductive leads extending generally horizontally and co-planar from the semiconductor chip.

24 Claims, 4 Drawing Sheets

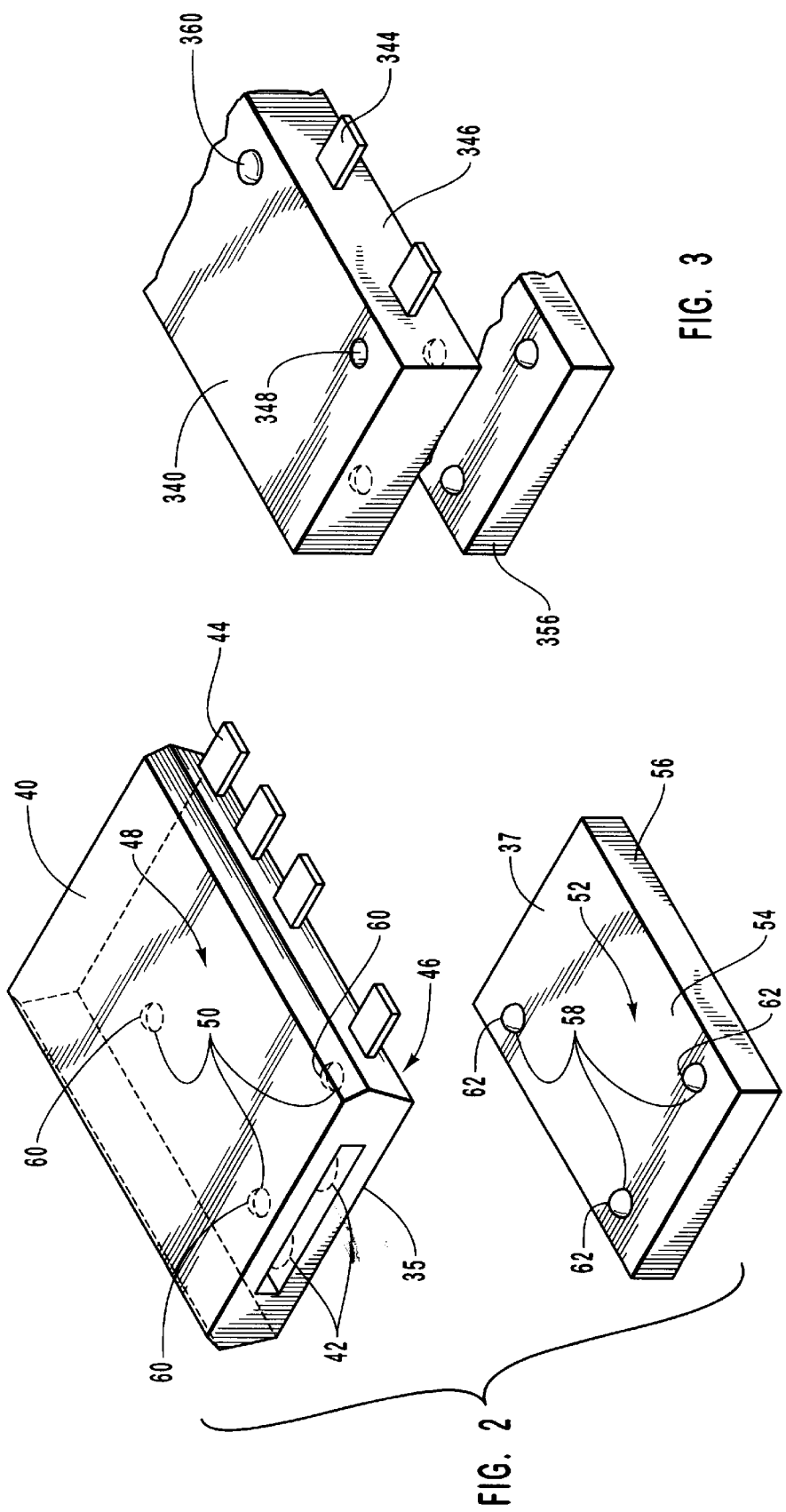

SEMICONDUCTOR CHIP PACKAGE

BACKGROUND OF THE INVENTION

1. The Field of the Invention

The present invention relates generally to testing semiconductor chip packages and particularly relates to an independently aligning semiconductor chip package, and method of using same, which economically improves the testing thereof.

2. The Relevant Technology

Financial incentives are ever present in all facets of the semiconductor chip industry to reduce material and labor burdens for each individual semiconductor chip produced. One facet readily receptive to improvements is electrical testing. Electrical testing, among other things, examines whether the electrical properties of the active devices of each semiconductor chip meet, exceed or fail defined standards of electrical integrity for the active devices. As such, not only are improvements embraced in the chip industry for new developments that increase the approval rates of semiconductor chips meeting or exceeding those defined standards, but so are developments that increase labor productivity while reducing material costs in the actual testing processes and procedures themselves.

In the past, the testing processes and procedures were not complicated since semiconductor chips had conductive leads extending from the active devices that were of sufficient strength, thickness and pitch, i.e., center-to-center distances between adjacent leads (often around 100 mils), and testing equipment could be directly attached onto the conductive leads. In this manner, however, inefficiencies were realized because labor was manual and the overall size of the chip package necessitated excessive materials.

Although conventional chip packages now have reduced in size, which equates to lower materials costs, the chips are no longer able to physically withstand direct attachment of testing equipment because their leads are less rigid, thinner and often have a pitch around 0.7 mm or less. An external structure, however, is often attached to the packages to provide support and alleviate inherent disadvantages during the testing of the active devices.

Smaller leads also cause alignment problems for modern testing equipment and processes. Because of their small pitch, testing contacts, which electrically mate with the leads, cannot now, without a high degree of alignment precision, be applied in the general direction of the leads, as with the antiquated leads having large pitch, and still have the proper test contact achieve an electrical contact with the proper lead. Even beyond accuracy of alignment, since modern testing is generally automated, the alignment process must be able to quickly and repetitiously align a proper test contact with a proper lead on each chip as numerous chip packages are progressed through the automated testing process.

As seen in FIG. 1, the prior art achieves both alignment and support for the conductive leads 16 of a semiconductor chip package 18 by engaging holes 26 in a bracket 28 that supportively surrounding leads 16 with posts 24 on an alignment apparatus 20. It should be appreciated that alignment apparatus 20 is part of the testing equipment and is generally computer controlled and positioned at a calibrated point in the automated process to ensure accurate alignment between conductive leads 16 and a set of testing contacts 32 if semiconductor chip package 18 is properly arranged thereon. In this illustration, semiconductor chip package 18 is properly arranged because holes 26 and posts 24, three each, are uniquely positioned such that only one matable position exists therebetween. In addition, each post is arranged with a top portion 29 having a substantially smaller diameter than the diameter of each hole 26 in order to provide ease of mating. The base portions 30 of posts 24, in contrast, are substantially equal to the diameter of holes 26 to restrict most freedom of movement by chip package 18 once fully seated on alignment apparatus 20, thereby even further ensuring proper arrangement between chip package 18 and the alignment apparatus 20.

After properly positioning chip package 18 seen in FIG. 1, conductive leads 16 are positioned between a raised surface 36 of alignment apparatus 20 and contacts 32 of a test probe unit 34 to enable electrical testing to be performed upon chip package 18. Thereafter, contacts 32, via conductive leads 16, provide electrical continuity between appropriate testing circuitry within the test probe unit (not shown) and the active devices (not shown). After testing and approval, bracket 28 is detached from its support position about conductive leads 16 and semiconductor chip package 18 is then readied for further processing incident to commercial distribution.

While generally effective, the foregoing requires materials for bracket 28 which are extraneous to the manufacture of the actual semiconductor chip package 18. In effect, bracket 28 alone, commonly known as a molded carrier ring (MCR), contains more plastic and epoxy molding compound than semiconductor chip package 18 itself. Although the actual material costs of each MCR is minimal per each chip package 18, material costs become an important factor given production quantities.

Moreover, the foregoing necessitates labor for attaching and detaching bracket 28 which labor is beyond the actual labor of conducting of electrical tests. As such, there is an incentive to find an alternative method of testing.

Concomitantly, the attachment and detachment of bracket 28, through processing and testing errors, can damage the conductive leads, the chip package and/or the active devices so as to reduce yield. It is, therefore, desirous to increase yield and reduce costs.

SUMMARY OF THE INVENTION

In accordance with the invention as embodied and broadly described herein, an improved semiconductor chip package is provided that is capable of independently aligning with testing equipment during the manufacturing phase of electrical testing. Independent alignment is realized by directly connecting the semiconductor chip package to the test alignment apparatus by fitting together two substantially conforming surfaces, one on the chip package and one on the alignment apparatus. The two conforming surfaces are arranged so that only one matable position can be assumed with respect to each other.

In preferred embodiment, a semiconductor chip package has a semiconductor chip with an active device, and a surface on the semiconductor chip having a first region offset from the surface for making a substantially conforming fit with a second region offset from a surface of an alignment fixture such that the semiconductor chip is held stationary relative to the alignment fixture.

Another preferred embodiment is a semiconductor chip for assuming an alignment position with respect to an alignment fixture such that the semiconductor chip is thereby held stationary relative to the alignment fixture. The alignment fixture has thereon a first alignment surface and an alignment plane that is offset from the alignment surface and defined by at least three points. The semiconductor chip includes an active device, a chip surface, and a chip plane that is offset from the chip surface and defined by at least three points The chip plane is parallel to the alignment plane when in the alignment position such that the semiconductor chip is thereby held stationary relative to the alignment fixture.

A still further preferred embodiment is a semiconductor chip package that includes a semiconductor chip having an active area, a plurality of conductive leads electrically connected to the active area, an encapsulating material on the semiconductor chip formed about the plurality of conductive leads, and a region on the encapsulating material that is offset from a surface of the encapsulating material for making a substantially conforming fit with an alignment fixture.

In another preferred embodiment, the substantially conforming surfaces equate to a plurality not less than three substantially conical indentations on the chip package and an equal number of conical protrusions or protuberances, of substantially conforming size and depth on the alignment apparatus. Once fitted, the at least three protrusions suspend the semiconductor chip in a substantially horizontal plane so that electrical tests contacts, also substantially in a horizontal plane, may be easily contacted with the conductive leads extending generally horizontally and co-planar from the semiconductor chip.

In an alternate embodiment, the semiconductor chip package aligns with, and 11 attaches to, a printed circuit board. The substantially conforming surfaces are at least three substantially conical protrusions extending from the chip package and an equal number of holes in the surface of the printed circuit board. Once fitted together, the semiconductor chip package is aligned and supported in an electrical circuit without employment of an external support structure.

These features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which:

FIG. 2 is a top perspective view of an independently aligning semiconductor chip package having a partial cutaway end view of two active devices according to a preferred embodiment of the present invention;

FIG. 3 is a top perspective view similar to the independently aligning semiconductor chip package of FIG. 2 having a solder ball arrangement on the package;

DETAILED DESCRIPTION OF THE PREFERRED EMBODIMENTS

The present invention relates to a novel semiconductor chip package capable of independently aligning with, and directly attaching to, an appropriate testing fixture during the manufacturing phase of electrical testing. Once aligned and attached, the testing fixture orients the chip package into a selected testing position based primarily upon the physical arrangement of the conductive leads of the chip package and the remaining test equipment.

With reference to FIG. 2, a semiconductor chip package, depicted generally as package 40, contains active devices 42 in electrical contact with conductive leads 44 for use in a great variety of applications, such as computers, television, communications, navigation, avionics, medical and other similar fields of technology. Package 40 has a surface 46 thereof, often formed by a molding compound, that is generally an electrically insulating formulation used to dissipate heat and to protect the active devices therein from thermomechanical stresses and pollutants found in the operating environment. Preferably, the compound of surface 46 is a thermosetting epoxy resin, and may also be silicon, is phenolic, polyeurethane, or ceramic. The compound actually selected is generally derived from a balance of numerous engineering factors well known in the art, the most salient factors being the cost of manufacturing, production volume, expected use environment, expected use market and other related considerations. It is also contemplated that the compound may be a polyimide compound useful as an alpha barrier.

Surface 46 at least partially encapsulates package 40 and is formed about conductive leads 44 in a manner that enables an electrically contiguous path to exist between tile conductive leads 44 and the active devices 42. The path, among other things, affords convenient external testing of the internally located active devices 42. The testing, performed by circuitry not shown, yields results that permit determinations to be made about whether the semiconductor chips are commercially viable and suitable for distribution or whether the chips should be repaired or discarded. Such tests include electrical continuity checks, such as for shorts and opens, and capacitance and resistance measurements.

Since the pitch of the conductive leads 44 themselves is very often minute, the testing process requires accurate alignment between the conductive leads 44 and the test equipment. Although the test processes and equipment are generally under computer control and are capable of fine adjustments, it is inefficient for the automated process to require rearrangement of the test equipment for each individual chip package 40, especially when considering the numerosity of the chips that require testing. Thus, for efficiency purposes, it is the individual chip package 40 that is altered with respect to the testing equipment.

Figure 1:
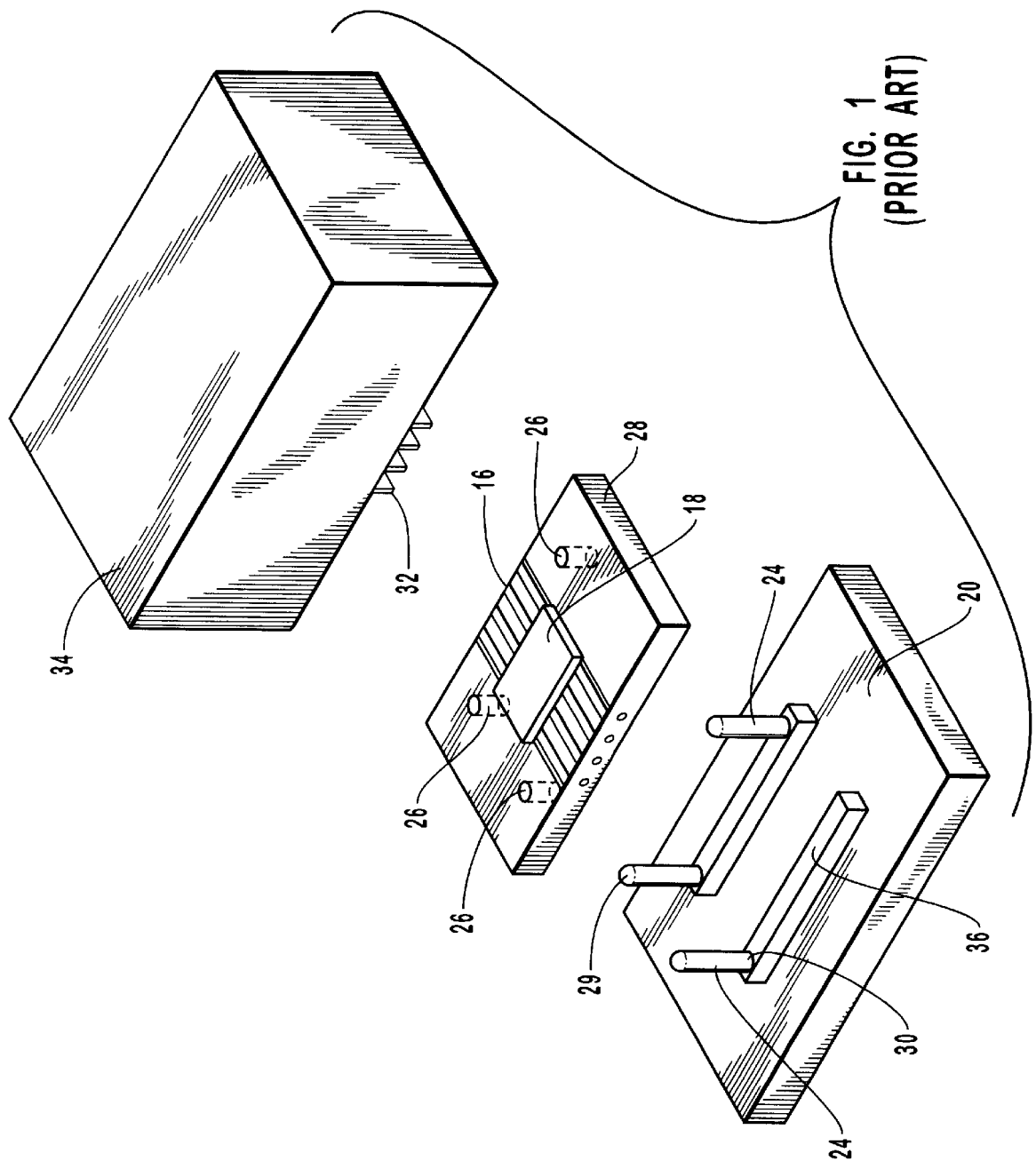
FIG. 1 is an exploded top perspective view of a prior art alignment and support structure for testing active devices in a semiconductor chip package.

In general accord with the prior art description of the test equipment in FIG. 1, a selected testing position is defined as one that simultaneously contacts the necessary number of electrical contacts 32 of a testing probe unit to a proper number of corresponding conductive leads 44 of the package 40. Thus, in a selected testing position, alignment is achieved by having a region 48, offset from the surface 46, configured in a first shape 50 to receive and conformingly fit with a second region 52. Similarly, the second region 52 is offset from a surface 54 of an alignment fixture 56 and configured in a second shape 58.

The first and second shapes 50, 58 are generally conforming so that package 40 can be gravity mated with the alignment fixture 56 and the package 40 can be biased into a desired testing position by the alignment fixture 56 at the surface boundaries where the first and second shapes 50, 58 meet. In this embodiment, the selected test position is a generally horizontal planar arrangement for the conductive leads 44 with the package 40 on top of the alignment fixture 56. This test position is frequently desired because the electrical contacts 32 of the test probe are often arranged generally horizontally in coplanarity. The actual testing of the package 40 occurs after positioning the conductive leads 44 between alignment fixture 56 and contacts 32 of FIG. 1. When so positioned, all conductive leads 44 are simultaneously engaged by electrical contacts 32 and appropriate measurements can be effectuated.

Other testing positions are selectable for different arrangements of test equipment and semiconductor chip packages. For example, with reference to FIG. 3, a package 340 has a surface 346 arranged with a plurality of solder balls 360 thereon that are in electrical contact with the active areas (not shown) via openings in the surface 348 formed in the surface 346. Certain testing equipment might then be preferably arranged to contact the solder balls 360 on top of the package 340 instead of on the sides of the package 340 at the conductive leads 344. In addition, the alignment fixture 356 might also be arranged to bias the conductive leads 344 or solder balls 360 of the package 340 in other than a substantially horizontal plane. Examples of this are inclined automated equipment and/or leads that are not themselves substantially co-planar, such as with leads disposed about the package in a manner not readily receptive to one test probe with co-planar contacts, i.e., a zig-zag in-line package (ZIP) or future variants having stair-step or castle-top profiles, for example.

Figure 4:
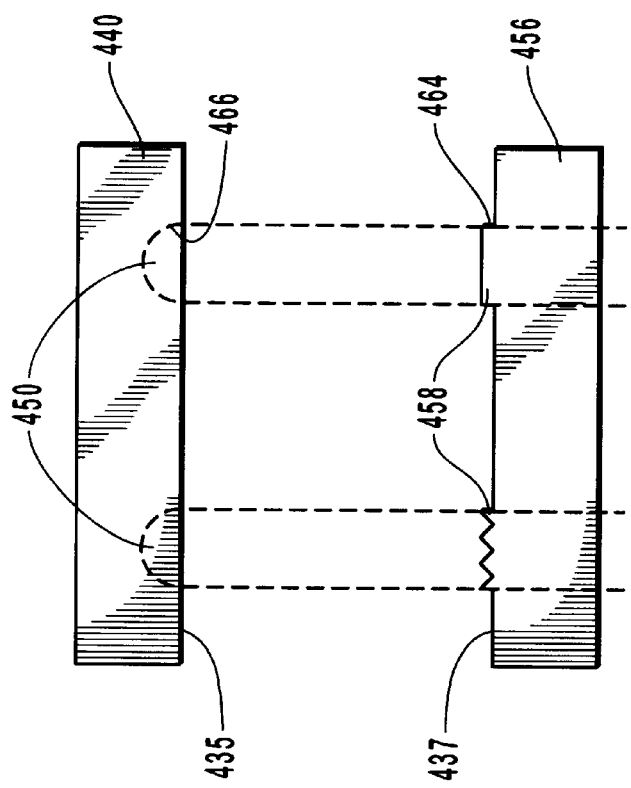
FIG. 4 is a side view of a non-conforming fit between the independently aligning semiconductor chip package of FIG. 1 and an alignment fixture.

While substantially conforming first and second shapes are preferred, it should be further appreciated that the first and second shapes might be of a substantially nonconforming shape, but still be of suitable design to orient the package into a selected test position. For example, with reference to FIG. 4, the first shape 450, defining a first volume, and the second shape 458, defining a second volume, may be fit together, such that a parallel interface between package 440 and alignment fixture 456 is achieved along a respective inner surface 435, 437 thereof, but wherein one volume substantially exceeds the volume of the other. Although one volume is substantially larger than the other, and the larger volume is determined by whether it is package 440 or alignment fixture 456 that has the protuberances or indentations, the alignment fixture can still adequately bias the package 440 into a selected test position. The biasing is still achievable because the sides 464 of the protruding shape, i.e., the second shape 458 is of sufficient vertical size to be substantially restricted by the corresponding internal walls 466 of the indented first shape 450, whenever the first and second shapes 450, 458 are fitted and a lateral or torsional force is applied by, or to, alignment fixture 456.

In a preferred embodiment seen in FIG. 2, the first shape 50 is comprised of three primary points 60, offset from the surface 46 of the package 40 by a first distance, and is configured to receive the second shape 58 comprised of three secondary points 62, offset from the surface 54 of the alignment fixture 56 by a second distance. By bringing a first plane, defined by the three primary points 60, substantially adjacent with a second plane, defined by the three secondary points 62, a substantially parallel interface between the package 40 and the alignment fixture 56 occurs along a bottom side 35 of the package and a top side 37 of the alignment fixture. The substantially parallel interface is achieved because the shapes are substantially conforming, both the bottom side 35 and top side 37 surfaces are substantially flat, and the first and second distances are substantially equidistant. While alignment can be enabled by only two points, three points is the minimum number of points that can define a plane. Three points define a plane on package 40, three points define a plant on alignment fixture 56, and when these two planes are substantially parallel due to conformal fitting of the respective three points of package 40 and alignment fixture 56, a proper testing position is achieved. Of course, more than three points on each of package 40 and alignment fixture 56 could also be used to achieve a proper testing position. In any event, at least three points are preferred in order to provide alignment, orientation and stability to the package 40 with respect to alignment fixture 56.

The manufacturing methods available for producing the substantially conical indentations or protuberances in their respective surfaces of the alignment fixture 56 or the package 40 are conventional, such as transfer-molding processes which can be used to make openings 348 in the surface 346 for solder balls 360 in FIG. 3. Preferably, the method includes producing mold parts (not shown) having either indentations or protuberances crafted into the surface thereof so that as the molding compound cures, the shape of the compound will approximate the surface of the molds.

The three primary points 60 and the three secondary points 62 have been illustrated as being the furthermost points away from their respective surfaces. The points need not necessarily be the furthest points. For example, since engineering imperfections can exist in the molds themselves, there often exists even further points on the surface area of the protuberances and indentations beyond those points specially designed to be the furthermost points. It is necessary only that the primary and secondary points respectively define substantially parallel planes when in an alignment position.

Figure 5:
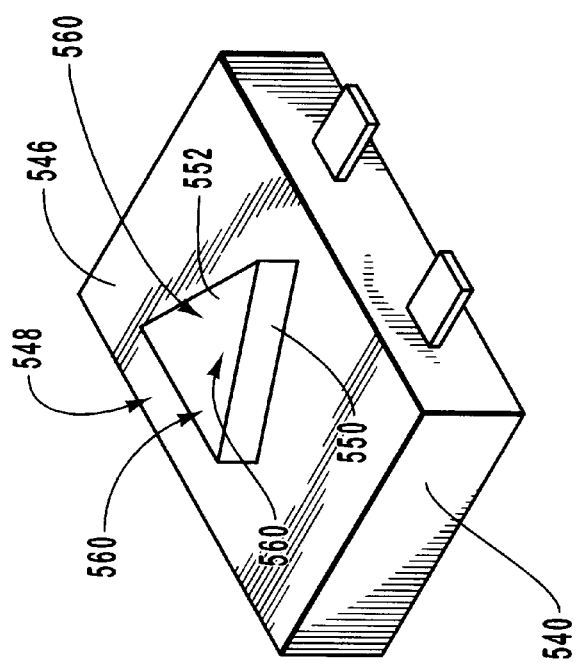
FIG. 5 is a bottom perspective view of an independently aligning semiconductor chip package according to an alternate embodiment of the present invention.

An alternative embodiment of the first shape is illustrated in FIG. 5, wherein a first region 548 comprises a first shape 550, being substantially a triangle projecting from a surface 546 of a package 540. The three dimensional projecting triangle is preferably fitted into a conformingly shaped triangular recess in an alignment fixture, not shown. The conformal fit of the respective projecting and recessing triangles is made by abutting the substantially planar surface, defined by three primary points 560 (selected randomly in FIG. 5) on the upper exterior 552 of the first shape 550, with a corresponding planar surface on the triangular recess. In this manner, a conforming fit is effectuated that allows planar alignment and orientation of the package 540 with respect to the alignment fixture.

Figure 6:
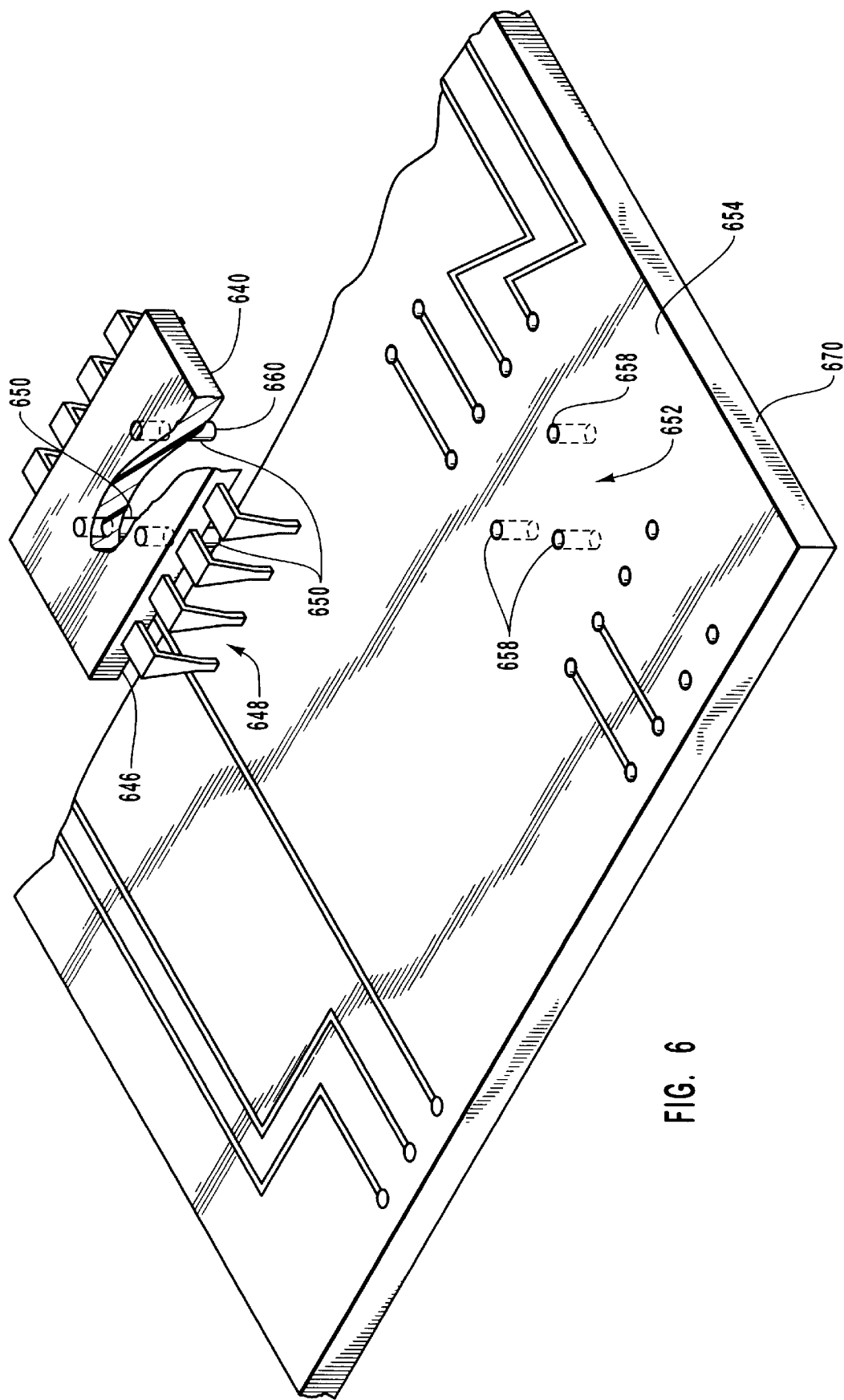
FIG. 6 is a top perspective view of an independently aligning semiconductor chip package capable of directly attaching to a printed circuit board according to yet another embodiment of the present invention.

Configuring the package to be alignable without an additional support structure, allows the package to be arranged for other uses beyond that of electrical testing. With reference to FIG. 6, for example, a package 640 has a first region 648, with a first shape 650 extending away from a surface 646 thereof, configured to fit with a second region 652. The second region 652, on a surface 654 of a printed circuit board 670, has a second shape 658 which fits in mating conformity with the first shape 650. In this embodiment, first shape 650 has three primary points 660 a furthermost distance away from the surface 646 that can be conformingly fitted with the second shape 658 by passing through three circular holes in the surface 654 of the printed circuit board 670.

In this manner, the package 640 remains independently alignable, and a selected interface between the package 640 and the printed circuit board 670 is still achieved therebetween. Having independent alignment capabilities, as described above, allows the package 640 to be efficaciously mounted to printed circuit board 670 under existing manufacturing methods. One such method contemplated is the picking of individual chip packages with an air chuck and then inserting the packages into the printed circuit boards.

While the foregoing description of mounting the package to the printed circuit board has been embodied as a "through-hole" package, it is equally the teaching herein that the first shape is mountable as a surface mounted package under the inventive surface mounted technology (SMT) to the second shape on the printed circuit board. Such first and second shapes being particularly contemplated and previously described as indentations and protrusions.

The present invention discloses elimination of an external structure for aligning and supporting the semiconductor chip package. The present invention may be embodied in even further specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A semiconductor chip package, comprising:
    a semiconductor chip enclosed in a compound and having an active device therein;
    a surface on said compound having a first region offset from said surface for making a substantially conforming fit with a second region offset from a surface of an alignment fixture such that the compound is held stationary relative to the alignment fixture;
    a conductive lead in electrical communication with the active device and extending both inside and outside of said compound.

2. A semiconductor chip package according to claim 1, wherein said first region of said surface on said compound is one of an indentation in a direction towards said active area and a protrusion extending in a direction away from said active area of said semiconductor chip enclosed in said compound.

3. A semiconductor chip package according to claim 1, wherein said first region has a surface area furthermost from said surface of said compound of sufficient size to form a plane.

4. A semiconductor chip package according to claim 1, wherein said first region comprises at least three points furthermost away from said surface on said compound that substantially defines a plane therebetween.

5. A semiconductor chip package for alignment to an alignment fixture having an alignment surface thereon, said semiconductor chip package including a material that encloses therein and holds stationary a semiconductor chip having an active device therein said alignment surface on said alignment fixture having a second region arranged in a second shape, said second shape being offset from said alignment surface, the semiconductor chip package comprising:
    a conductive lead in electrical communication with the active device and extending both inside and outside of said material;
    an exterior surface on said material having a first region arranged in a first shape, wherein said first shape:
        is offset from said exterior surface on said material; and
        is for receiving said second shape projecting into said first shape so as to make a substantially conforming fit with said second shape such that the semiconductor chip is thereby held stationary relative to the alignment fixture.

6. A semiconductor chip package according to claim 5, wherein said first region has at least three points furthermost away from said exterior surface on said material that defines a plane therebetween.

7. A semiconductor chip package for alignment to an alignment fixture having an alignment surface thereon, said alignment surface on said alignment fixture having a second region arranged in a second shape, said second shape being offset from said alignment surface, the semiconductor chip package comprising:
    an active device within a semiconductor chip;
    a material that surrounds and encloses the semiconductor chip, said material being selected from a group consisting of an epoxy resin, silicon, phenolic, polyeurethane, polyimide, and ceramic;
    a conductive lead in electrical communication with the active device and extending both inside and outside of said material;
    a surface on said material having a first region arranged in a first shape, wherein said first shape:
        is offset from said surface on said material; and
        is for projecting into said second shape to therewith make a substantially conforming fit such that the semiconductor chip is thereby held stationary relative to the alignment fixture.

8. A semiconductor chip package for assuming an alignment position with respect to an alignment fixture such that the semiconductor chip package is thereby held stationary relative to the alignment fixture, said alignment fixture having thereon a first alignment surface and having an alignment plane offset from said alignment surface and defined by at least three points, the semiconductor chip package comprising:
    an active device within a semiconductor chip;
    a material that surrounds and encloses the semiconductor chip, said material being selected from a group consisting of an epoxy resin, silicon, phenolic, polycurethane, polyimide, and ceramic;
    a conductive lead in electrical communication with the active device and extending both inside and outside of said material;
    an exterior surface on said material;
    a plane offset from said exterior surface on said material and defined by at least three points and being parallel to the alignment plane when in said alignment position such that the semiconductor chip is thereby held stationary relative to the alignment fixture.

9. A semiconductor chip package according to claim 8, wherein said at least three points of said plane offset from said exterior surface on said material are furthermost away from said chip surface.

10. A semiconductor chip package alignment system comprising:
    a semiconductor chip having an active device therein;
    a material enclosing the semiconductor chip and having an exterior surface thereon, said material being selected from a group consisting of an epoxy resin, silicon, phenolic, polyeurethane, polyimide, and ceramic;

a conductive lead in electrical communication with the active device and extending both inside and outside of said material;

a first region on said exterior surface of said material, said first region defining a first volume that is offset by said exterior surface, said first volume defining an exterior plane defined by three points;

an alignment fixture having a second region, said second region defining a second volume that is offset from an alignment surface on said alignment fixture, said second volume defining an alignment plane defined by three points, wherein said first region is capable of receiving said second region such that said exterior plane and said alignment plane are substantially parallel, the semiconductor chip is thereby held stationary relative to the alignment fixture, and an interface is formed by at least one of:

a concave portion of said exterior surface of said material and a convex surface of said alignment fixture; and a convex portion of said exterior surface of said material and a concave surface of said alignment fixture.

11. A semiconductor chip package according to claim 10, wherein said first volume is larger than said second volume.

12. A semiconductor chip package according to claim 10, wherein said first volume is smaller than said second volume.

13. A semiconductor chip package alignment system comprising:

a semiconductor chip having an active device, said semiconductor chip being enclosed within a material, said material having an exterior surface thereon, said exterior surface having at least three primary points that are offset by a first distance from said exterior surface, said three primary points defining a first plane;

an alignment fixture having at least three secondary points that are offset by a second distance from an exterior surface on said alignment fixture, said three secondary points defining a second plane, said first and second distances being substantially equidistant, said first plane and second being configured such that said at least three primary points can be moved proximally to said at least three secondary points such that said first and second planes are substantially parallel.

14. A semiconductor chip package according to claim 13, wherein each of said three primary points comprise a furthermost region of a concave surface and each of said three secondary points comprise a furthermost region of a convex surface.

15. A semiconductor chip package according to claim 13, wherein each of said three primary points comprise a furthermost region of a convex surface and each of said three secondary points comprise a furthermost region of a concave surface.

16. A semiconductor chip package having a semiconductor chip with active devices, a plurality of conductive leads bonded to said active devices, said plurality of conductive leads for accommodating remote electrical testing equipment for testing the electrical integrity of said active devices, wherein a compound encapsulates said semiconductor chip and at least partially encapsulates said plurality of conductive leads, the semiconductor chip package comprising:

a region offset from a surface of said compound having at least three primary points defining a plane, said region being capable of receiving three secondary points offset from a surface of an alignment fixture such that when said at least three secondary points are received by said at least three primary points, an inner surface of said semiconductor chip package is oriented into a substantially parallel interface with an inner surface of said alignment fixture.

17. A semiconductor chip package according to claim 16, wherein said plurality of conductive leads extend from said semiconductor chip package in a substantially co-planar arrangement thereof.

18. A semiconductor chip package, comprising:

a semiconductor chip having an active area;

an encapsulating material enclosing said semiconductor chip; and a region on said encapsulating material offset from a surface of said encapsulating material for making a substantially conforming fit with an alignment fixture.

19. A semiconductor chip package according to claim 18, further comprising:

an opening formed in said encapsulating material that provides electrical access to said active area by an electrical conductor within said opening; and a solder ball on a surface of said encapsulating material and being in electrical communication with said active area through said electrical conductor in said opening.

20. A semiconductor chip package, comprising:

a semiconductor chip having an active area;

a plurality of conductive leads electrically connected to said active area;

an encapsulating material that encapsulates said semiconductor chip and is formed about said plurality of conductive leads; and a region on said encapsulating material offset from a surface of said encapsulating material for making a substantially conforming fit with a printed circuit board.

21. A semiconductor chip package according to claim 20, wherein said encapsulating material is one of a through-hole arrangement and a surface mount arrangement.

22. A semiconductor chip package according to claim 20, wherein said encapsulating material is molded to form one of a protrusion and an indentation.

23. A semiconductor chip package, comprising:

a semiconductor chip having an active device;

a conductive lead electrically connected to said active device;

a compound enclosing said semiconductor chip, said conductive lead extending into and out of said compound;

three indentations in an inner surface of said compound for receiving three protrusions on an inner surface of an alignment fixture so that when said three protrusions are received by said three indentations a substantially conforming fit is achieved thereby forming a substantially parallel interface between said inner surface of said compound and said inner surface of said alignment fixture.

24. A semiconductor chip package according to claim 23, wherein when said substantially conforming fit is achieved, the semiconductor chip is held stationary relative to the alignment fixture.

* * * * *

UNITED STATES PATENT AND TRADEMARK OFFICE
CERTIFICATE OF CORRECTION

PATENT NO. : 6,198,172 B1
DATED : March 6, 2001
INVENTOR(S) : Jerrold L. King; Leland R. Nevill Page 1 of 1

It is certified that error appears in the above-identified patent and that said Letters Patent is hereby corrected as shown below:

Column 1,
Line 12, change "arc" to -- are --.
Line 60, change "surrounding" to -- surround --

Column 2,
Line 36, between "of" and "conducting" insert -- the --

Column 3,
Line 5, after "points" insert a period
Line 30, before "attaches" delete [11]

Column 4,
Line 31, after "silicon," delete [is]
Line 32, change "polyeurethane" to -- polyurethane --

Column 6,
Line 16, change "plant" to -- plane --

Column 8,
Line 49, change "polycurethane" to -- polyurethane --

Signed and Sealed this

Twenty-sixth Day of February, 2002

Attest:

Attesting Officer

JAMES E. ROGAN
Director of the United States Patent and Trademark Office